(12) United States Patent
Williams et al.

(10) Patent No.: US 6,898,217 B2
(45) Date of Patent: May 24, 2005

(54) ULTRASONIC TUNABLE LASER

(75) Inventors: David L. Williams, Mountain View, CA (US); Marcin Hejka, Warsaw (PL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/334,259

(22) Filed: Dec. 31, 2002

(65) Prior Publication Data

US 2004/0125829 A1 Jul. 1, 2004

(51) Int. Cl.[7] .............................. H01S 3/117; H01S 3/10
(52) U.S. Cl. .............................. 372/20; 372/13; 372/23; 372/28
(58) Field of Search .............................. 372/13, 20, 23, 372/28, 43, 50, 32, 64, 21, 26, 97

(56) References Cited

U.S. PATENT DOCUMENTS

| | | | | |
|---|---|---|---|---|
| 3,906,393 A | * | 9/1975 | Fletcher et al. | 372/96 |
| 4,532,632 A | * | 7/1985 | Yamashita et al. | 372/50 |
| 5,197,074 A | * | 3/1993 | Emmons et al. | 372/26 |
| 5,384,799 A | * | 1/1995 | Osterwalder | 372/32 |

* cited by examiner

Primary Examiner—Wilson Lee
Assistant Examiner—Armando Rodriguez
(74) Attorney, Agent, or Firm—Marshall, Gerstein & Borun LLP

(57) ABSTRACT

A tunable laser device produces a laser energy over a range of frequencies. A property of an ultrasonic transducer or, more specifically, the frequency of an ultrasonic wave created by the ultrasonic transducer is altered to change the laser frequency of the tunable laser device. The ultrasonic transducer may couple its ultrasonic wave directly into the laser source or may form a tunable acousto-optic modulator external to the laser source. In both cases, the ultrasonic wave creates an index of refraction perturbation in an optical substrate, through which the laser energy of the laser source passes. Changes in the ultrasonic wave cause changes in the perturbation through which the laser energy passes, which in turn, changes the frequency of the laser energy, thereby enabling the frequency of the laser to be tuned.

10 Claims, 6 Drawing Sheets

ULTRASONIC TUNABLE LASER

FIELD OF THE DISCLOSURE

This patent generally relates to lasers and more specifically to ultrasonic tunable lasers.

BACKGROUND OF THE PRIOR ART

Communication networks are known to employ laser sources in many different forms, from transponders to gain regions in amplifiers. Generally, these laser sources are characterized by an output bandwidth and output (or laser) frequency. In smaller-scale communication networks, like an enterprise network for example, a single frequency laser (850 nm) may be used to transmit data. For larger bandwidth applications, for example, links between metro-area networks (MANs), a dense wavelength division multiplexing (DWDM) system employs lasers over a range of frequencies. A DWDM system may include 100 channels, each channel emitting from a laser producing a different output frequency within a range of 1525–1565 nm. Output frequency and output bandwidth are the key design criteria for the network transponders housing these lasers. In the DWDM system in particular, control over frequency and bandwidth parameters is important to ensure proper channel spacing. Numerous industry standards, for example, pertain to output frequency and bandwidth spacing control.

Using tunable lasers in network devices is known. With tunable lasers, a manufacturer can choose from numerous, different output frequencies/wavelengths. Tunable lasers reduce manufacturing costs and eliminate the need for producing separate lasers of different output frequencies. Tunable lasers are also desirable because they are less susceptible to fabrication errors. If the desired output frequency is not exact, tuning the laser will take an otherwise useless output and tune it to a useful one. Some non-tunable/single frequency lasers may be tuned by temperature tuning, but the tuning is over a very small frequency range, one too small for tuning between different channels.

There are two primary ways of configuring a tunable laser. The first is via multi-segment Bragg reflectors (DBR). The second is via an external laser cavity. With respect to the former, each DBR serves as a highly reflective mirror cavity that produces a narrow-bandwidth output signal at a characteristic frequency. In some devices, selectively activating the DBR corresponding to the desired output frequency provides tuning. Each DBR is connected to a lead and separately activated. In other devices, like sampled-grating DBRs, electrical current is controlled to align reflection peaks between gratings, thereby tuning the device. Control over the electrical current is very difficult to achieve, however.

Multi-segment DBRs, while functional, have numerous drawbacks. These devices require individual control of each grating, which translates into increased control complexity. These devices have limited scalability. Additionally, because multi-segment DBRs must be formed to exacting layer width tolerances, more expensive fabrication techniques are required to create large numbers of DBRs and electrodes.

Another problem common to the multi-segment DBR tunable lasers is mode hopping. Here, the frequency of the output signal inadvertently hops from one output value to another output value. In the DWDM context, for example, such mode hopping would result in a multi-segment DBR tunable laser emitting at a frequency corresponding to one data channel and then inadvertently hopping to another frequency corresponding to another data channel. As a result of this mode hopping, a single data stream would be transmitted on different data channels, which is undesirable.

In an external cavity laser, a gain medium is placed between two mirrors, and one or both of the mirrors are moved to change the lasing cavity length. Additionally, a tuning element may be inserted into the cavity to select which of the modes will lase. Unfortunately, these external cavity lasers have moving parts that are expensive to fabricate. For example, some have proposed costly microelectronic mechanical systems (MEMS) devices to adjust the position of the moving components.

Other drawbacks exist. Moving parts must be reliably adjustable over extremely short distances, leaving them susceptible to performance degradation over time. Additionally, external cavity lasers are large in size and can result in undesirable coupling loss as energy is coupled into and out of the resonant cavity.

DETAILED DESCRIPTION

Figure 1:
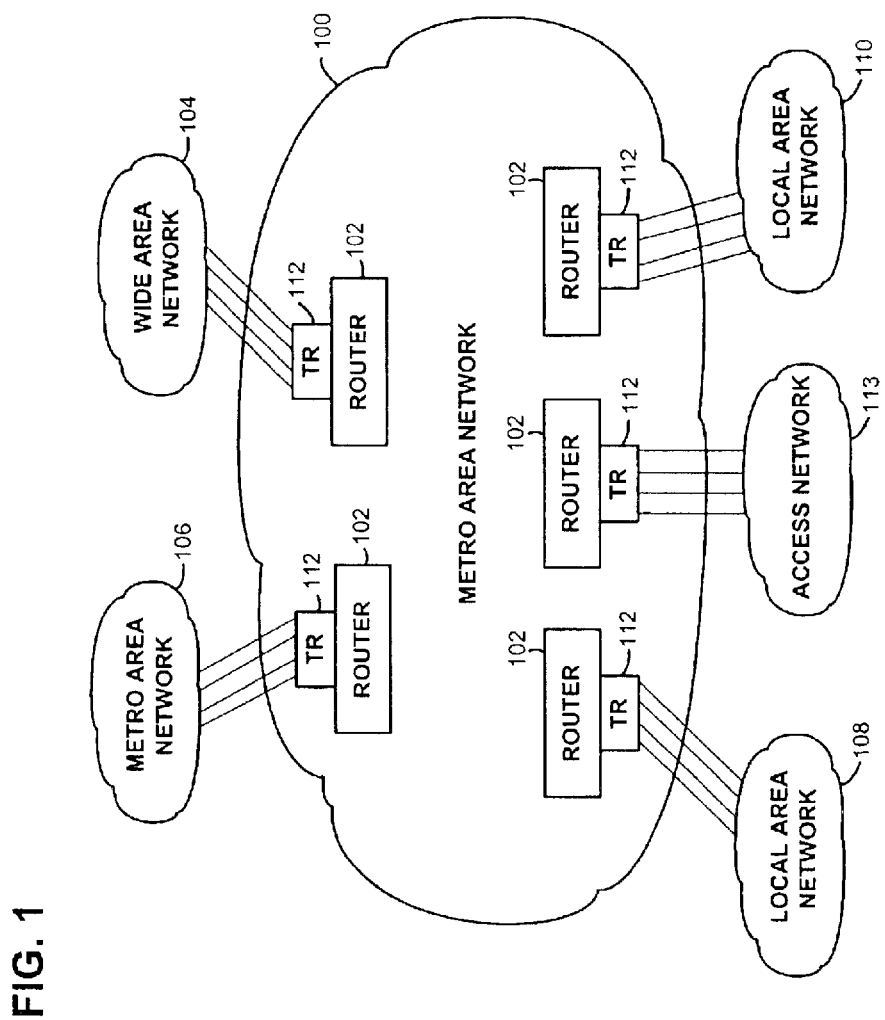
FIG. 1 is a schematic of an example metro-area network having a plurality of routers and transponders.

FIG. 1 illustrates an example metro-area network (MAN) 100, which may be a DWDM network. The MAN 100 includes a plurality of routers 102 that may be interconnected in a ring configuration, for example. The routers 102 form a backbone of the MAN 100, through which data from a wide-area network (WAN) 104 or a second MAN 106 may be received and locally routed. In the illustrated example, the MAN 100 also has routers 102 connected to a first local-area network (LAN) 108, a second LAN 110, and an access network 113, such as a remote access network or server access network. The MAN 100 may be connected to an enterprise network or other network. At the head of each router 102 is a transponder 112 for sending and receiving data. The transponder 112 may be a multi-channel transponder, such as DWDM device communicating between MANs, or the transponder 112 may transmit and receive at a single frequency, as might be sufficient for communicating with smaller networks, like LANs. While identical transponders 112 are shown, it will be appreciated by persons of ordinary skill in the art that any of the transponders 112 may be different from one another. Furthermore, the illustration of FIG. 1 is by way of example and may include additional networking components not shown.

Figure 2:
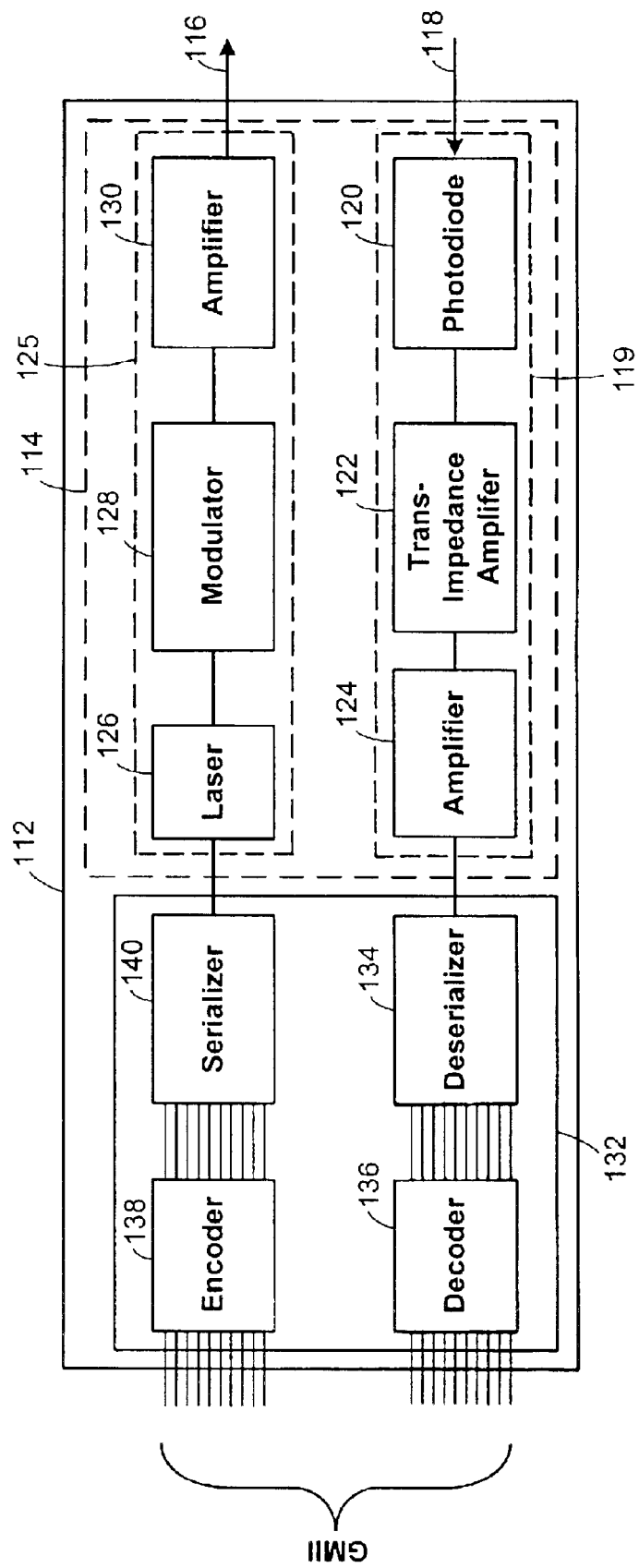
FIG. 2 is a block diagram of a transponder used in the metro-area network of FIG. 1.

FIG. 2 shows an example high-level block diagram of the transponder 112. The transponder 112 includes a transceiver 114 for transmitting and receiving data streams along fibers 116 and 118, respectively. The receiver line 119 includes a photodiode 120 which performs optical-to-electrical signal conversion, a trans-impedance amplifier 122, and a separate boosting amplifier 124. The transmitter line 125 includes a laser 126, a modulator 128, and an amplifier 130. While a single transceiver 114 is shown, it will be understood by persons of ordinary skill in the art that the transponder 112 may have multiple transceivers or that each depicted block may represent a bank of blocks; for example, blocks 120 and 126 may be a plurality of photodiodes or lasers, respectively.

The transceiver 114 is connected to a controller 132, which may represent a single application specific integrated circuit (ASIC), multiple integrated circuits, or a microprocessor, for example. The controller 132 may be formed from a microcontroller like the 8051 microcontroller available from Intel Corporation. A microprocessor may also be used, such as any one of the Intel family of microprocessors, including Pentium®, Xeon™, and Itanium™-based microprocessors. Alternatively, a chipset like the LXT16768, LX16769, or LXT16759 products also made by Intel Corporation may be used. For the receiver line 119, the controller 132 includes a deserializer 134 coupled to the amplifier 124 and a decoder 136 coupled to the deserializer 134. For the transmitter line 125, the controller 132 includes an encoder 138 and a serializer 140.

In operation, a multi-channel or single channel data stream is received via the fiber 118. The multi-channel data-stream is coupled into the photodiode 120 for optical-to-electrical signal conversion. Data from the photodiode 120 is coupled to the trans-impedance amplifier 122 and on to the amplifier 124 prior to appearing at the deserializer 134. The deserializer 134 provides a 10 bit signal to decoder 136 that decodes the input signal. The 10 bit word from the decoder 136 may be passed to a Gigabit Media Independent Interface (GMII). For data transmission, input data from the GMII is first encoded by the encoder 138 and then serialized by the serializer 140 to create a transmittable serial bit stream. The output from the serializer 140 controls the output of the laser 126, said output being modulated by the modulator 128 and then amplified by the amplifier 130 prior to transmission on the fiber 116.

While, the illustration of FIG. 2 is an example, it will be understood by persons of ordinary skill in the art that additional control blocks and routines may be used or that some of the control blocks of FIG. 2 may be eliminated or replaced. For example, the controller 132 may include an internal clock, a clock and data recovery device (CDR), phase control via phase locked loops (PLL), and/or error correction control circuitry. Furthermore, while not necessary, the transponder 112 may be compliant with any known network communications standards of which SONET formats OC-48 (2.5 Gbps), OC-192 (10 Gbps), and OC-768 (40 Gbps) are examples.

Figure 3A:
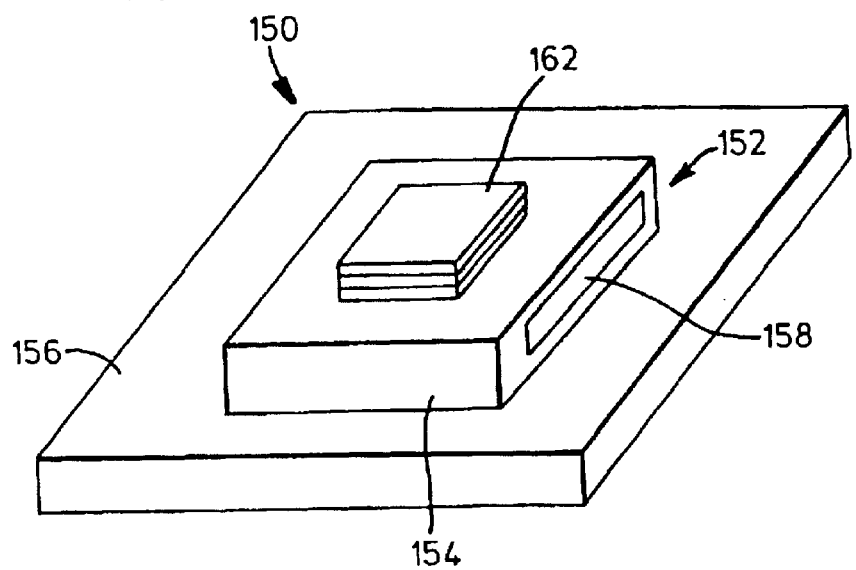
FIGS. 3A and 3B illustrate of an example tunable laser wherein a tunable acoustic wave has been formed within a gain region.
Figure 3B:
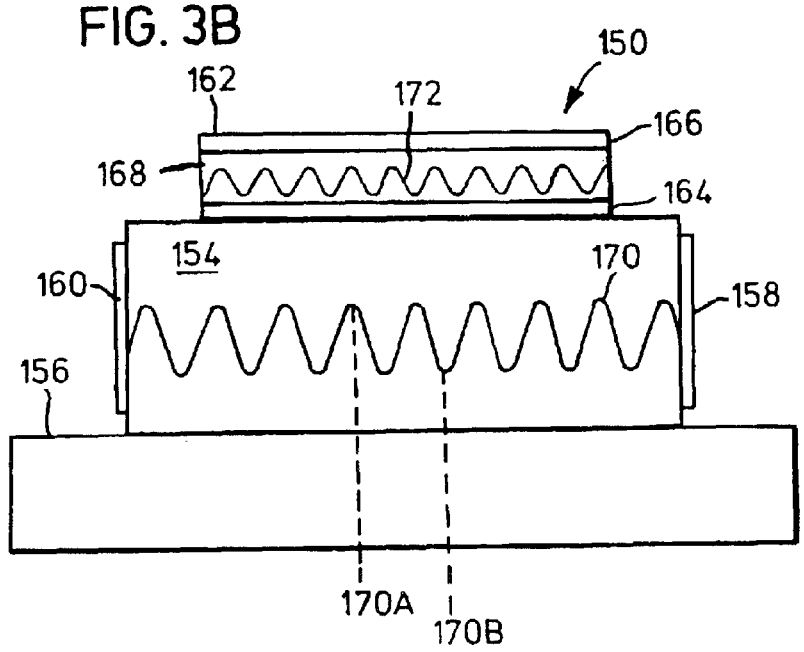

FIGS. 3A and 3B illustrate an example tunable laser 150 that may be used as the laser 126 of FIG. 2. The tunable laser 150 includes an ultrasonic transducer 152 formed of an acoustically-responsive substrate 154, e.g., a piezoelectric substrate. Suitable materials for the substrate 154 include any known piezoelectric material, like crystalline quartz or lead zurcinate titinate, also known as PZT. PZT, for example, may be undoped or doped. In the latter case, many available dopant atoms are known, one being La which forms a material commonly termed PLZT. In any event, numerous suitable glasses and ceramics will be known to persons of ordinary skill in the art. The substrate 154 may spin coated on a support substrate 156, which may be silicon.

First and second electrodes 158 and 160 (see FIG. 3B) are formed on the acoustically-responsive substrate 154 and may receive an AC drive signal for forming the ultrasonic wave in the transducer 152. Different AC drive signals will result in different ultrasonic waves. The transducer 152 is adjacent a laser source 162, such that the ultrasonic wave from the transducer 152 may be coupled into the laser source 162. In this manner, the ultrasonic transducer 152 may be used to form a tunable ultrasonic wave that appears in the laser source 162. Further, while ultrasonic waves are described, many different sound waves may be formed and coupled into the laser source 162, with this example.

As illustrated in FIG. 3B, the laser source 162 includes a first cladding layer 164 and a second cladding layer 166 with a gain region 168 extending between the two cladding layers 164 and 166. The cladding layer 164 may be directly formed on or mounted to the top surface of the substrate 154, thus providing direct coupling of the ultrasonic wave created in the transducer 152. Suitable mountings include adhesive mounting, clamp mounting, chemical bonding, soldering, or welding. For example, an acoustically-transparent layer, like an acoustically-transparent glue, may be used to contact the cladding 164 adjacent the substrate 154. In a further example, the laser source 162 may have a suspended mounting or a slidable engagement with the substrate 154, to avoid any unwanted transfer of mechanical energy during transducer operation, e.g., to restrain the laser source 162 against movement.

In an example, the gain region 168 is a semiconductor optical amplifier (SOA), such as a III–V compound semiconductor structure. Suitable SOA materials will be known to those of ordinary skill in the art and include InP and InGaAS, though any suitable lasing material that may also function as an acousto-optic material may be used for the gain region 168.

In operation of the tunable laser 150, an RF drive signal is applied across the electrodes 158 and 160 to form an acoustic wave 170 within the substrate 154. The acoustic wave 170, with peaks and troughs 170A and 170B, respectively, may be a standing wave or a traveling wave. The acoustic wave 170 is coupled into the gain region 168 through the cladding layer 164, creating an acoustic wave 172 therein. The acoustic wave 172 will have a similar effect to that of a DBR. The peaks and troughs of the acoustic wave 172 create a periodic, alternating index of refraction change within the gain region 168. The result is a perturbation on the index of refraction seen by light propagating in the gain region 168. As a result, the output energy from laser source 162 will have a peak frequency dependent upon the periodicity of acoustic wave 172. As the spacing between peaks of the wave 172 changes, i.e., the frequency of the acoustic wave 172 changes, the laser frequency of the laser source output energy changes. Typical laser frequencies may be tuned around 1550 or 1310 nanometers (nm), the low-loss windows or bands commonly used in optical fiber communications, although any laser frequency range may be formed.

Generally, the desired frequency of the acoustic wave 170 and the RF drive signal is provided by the relation $c=\lambda v$, where ν is the frequency of the acoustic wave 172, c is the speed of sound in the gain region 168, and λ is the wavelength of the acoustic wave 172, which would be the same as the wavelength of the lightwave from the laser 150, e.g., 1550 nm. As a result, the acoustic wave 170 is an ultrasonic wave. By changing the RF drive signal applied across electrodes 158 and 160, the frequency of the acoustic waves 170 and 172 will change, as will the frequency of the light wave from the laser 150. Thus, by adjusting the spacing between the peaks of the wave 172, the output (or laser) frequency of the laser 150 may be tuned across a range of values.

Numerous alternative examples based on the principles inherent in the above example may be implemented. For example, while the substrate 154 is described as a single piezoelectric material, the substrate 154 may include multiple sections each of different material. In fact, these materials need not be piezoelectric materials. Further, the substrate 154 may be modified to shape the acoustic wave 170 or block all or part of the acoustic wave 170 from coupling into certain portions of the laser source 162. Further still, while a single electrode pair 158–160 is shown, dual electrode pairs may be used.

Figure 4:
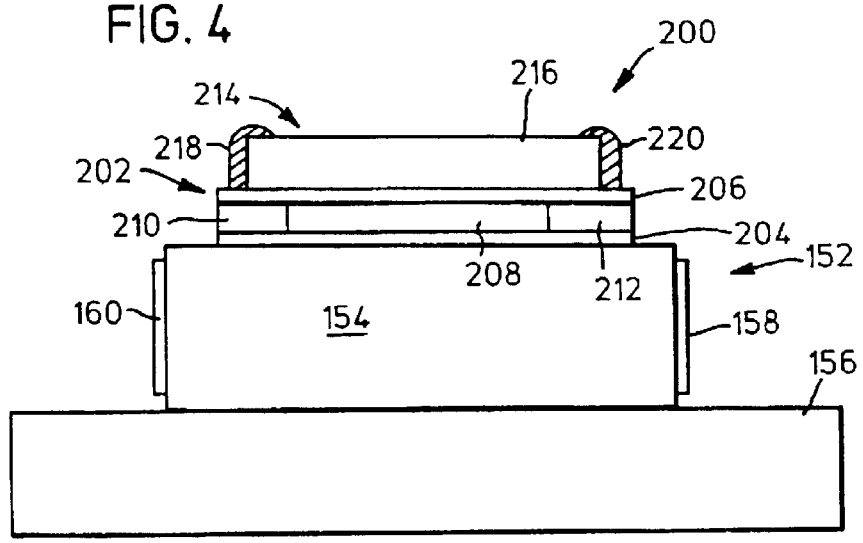
FIG. 4 is a side illustration of another example ultrasonic tunable laser.

FIG. 4 illustrates another example tunable laser 200 that may be used as the laser 126. For like components, reference numbers from FIGS. 3A and 3B have been retained. The laser source 162 is replaced with a laser source 202, that includes a first cladding layer 204 and a second cladding layer 206 disposed on opposing sides of a gain region 208, all similar to structures described above. The laser source 202 may be formed on or mounted on the ultrasonic transducer 194. The tunable laser 200 differs from that of the example laser 150 by the existence of a first passive region 210 and a second passive region 212 disposed on opposing sides of the gain region 208. The passive regions 210 and 212 may be transparent throughout the entire frequency range of operation of the tunable laser 200. Alternatively, one or both of the regions 210 and 212 may be wholly or partially reflective to direct output energy to one side or the other of the laser source 202. The passive regions 210 and 212 protect the gain region 208 from environmental conditions, as well as from edge damage. The passive regions 210 and 212 are optional.

On the cladding layer 206 is a second ultrasonic transducer 214 formed of a piezoelectric substrate 216 and two drive electrodes 218 and 220. The substrate 216, for example, may be any of the piezoelectric materials herein described and may be formed in a known manner. The two ultrasonic transducers 152 and 214 may have a cumulative effect in the gain region 208, where the gain region acoustic wave becomes the superposition of the two transducer acoustic waves. If the two electrode pairs, (158 and 160) and (218 and 220), receive the same drive signal, a lower intensity drive signal may be used to induce the same index of refraction perturbation within gain region 208. The two drive signals need not be identical, though. Furthermore, by altering the relative frequencies of the drive signal, complete cancellation or a beat frequency periodicity profile may be imposed on the index of refraction perturbation.

Figure 5:
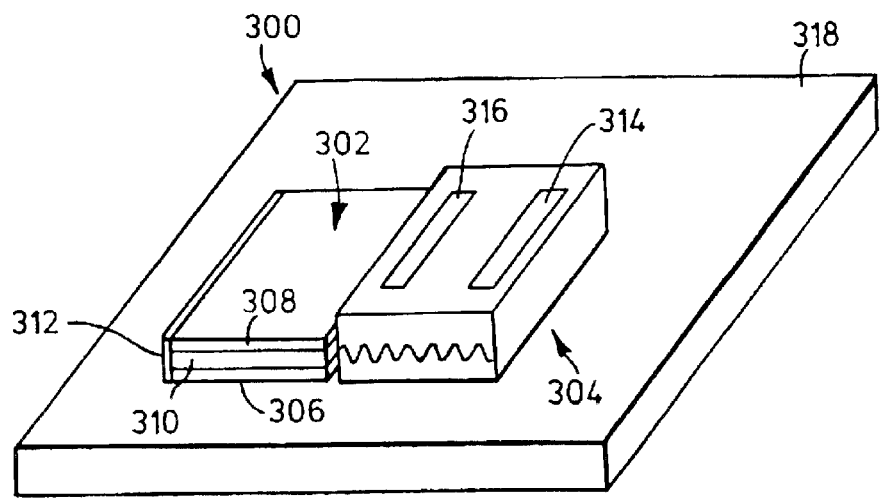
FIG. 5 is an illustration of another example tunable laser with a laser source and tunable acousto-optic modulator.

FIG. 5 illustrates another example tunable laser 300 that may be used as the laser 126. Whereas the example tunable lasers 150 and 200 are formed such that an ultrasonic standing wave extends into a gain region of a laser, the example tunable laser 300 employs a gain region that is un-perturbed by an acoustic wave. The tunable laser 300 is formed of two parts, a laser source 302 and an external acousto-optic modulator (AOM) 304. The laser source 302 includes a first cladding layer 306 and a second cladding layer 308 sandwiching a gain region 310. A highly reflective mirror 312 is displayed at one end of the laser assembly 302. Suitable mirrors will be known to persons of ordinary skill in the art; a DBR stack is one example. The AOM 304 is at an opposing end of the laser source 302 than the mirror 312 and is driven by two electrodes, 314, 316 on the AOM 304.

The electrodes 314, 316 receive an RF drive signal that is varied to tune the laser frequency of the tunable laser 300. In operation, the AOM 304 acts as a tunable mirror opposite the mirror 312. The reflection characteristics of the AOM 304 will change with the changes to the frequency of the drive signal to the electrodes 314 and 316. A higher frequency drive signal may result in a reduction in the wavelength of the lightwave from the laser 300, while a lower frequency drive signal may result in a longer wavelength on that lightwave. The AOM 304, although highly reflective, is also partially transmitting to allow laser energy to escape. Alternatively, or additionally, the mirror 312 may be partially transmitting.

The AOM 304 and the laser assembly 302 of the illustrated example are mounted on a substrate 318. The substrate 318 may be a microbench with etched recesses for the assemblies 302 and 304, although other mounting, clamping, or bonding techniques will be known to persons of ordinary skill in the art.

The laser 302 and AOM 304 may be in direct contact with one another at their adjacent inner faces or they may be spaced apart as shown in FIG. 5. Further, the spacing between the two may or may not include an anti-reflection region, such as an antireflection gel, to further reduce insertion or coupling losses.

Figure 6:
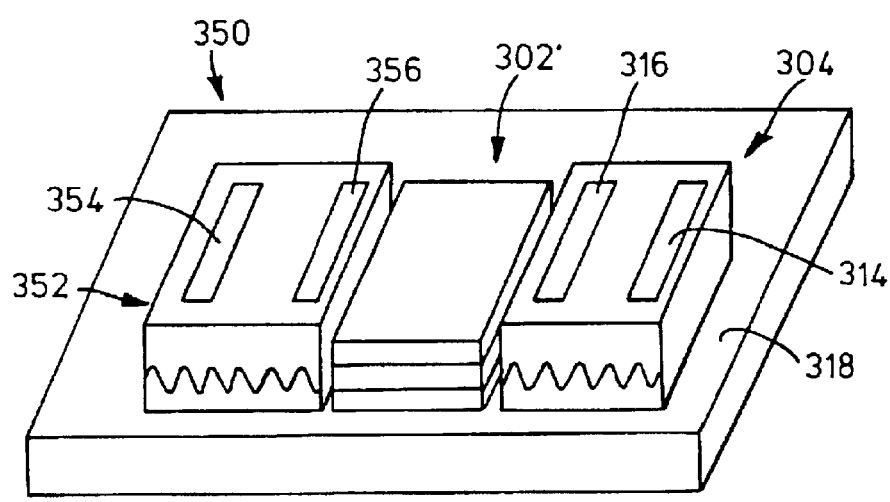
FIG. 6 is an illustration of another example tunable laser with a laser source and two tunable acousto-optic modulators.

Another example tunable laser 350 that may be used as the laser 126 is illustrated in FIG. 6. The tunable laser 350 is similar to the tunable laser 300 and, therefore, the same reference numerals are used for like components. The tunable laser 350 includes a laser source 302', the first tunable AOM 304, and a second tunable AOM 352 in place of the reflector 312. The AOM 352 includes electrodes 354, 356 that are controlled in a similar manner to the electrodes 304, 316 of the AOM 304.

The same or different controllers may supply an identical drive signal to the AOM 304 and the AOM 352. As with the tunable laser 300, the laser source 302' and each AOMs 304 and 352 may be coupled together through an index matching antireflection coating gel or layer in the spacings therebetween. The laser source 302' may be in direct contact with the AOMs 304 and 352. With the tunable laser 350, smaller bandwidths may be achieved and the tuning of the laser assembly 302 may be achieved more quickly in comparison to the state of the art. Any of the known mounting, clamping, or bonding techniques may be used to assemble the tunable laser 350.

Figure 7:
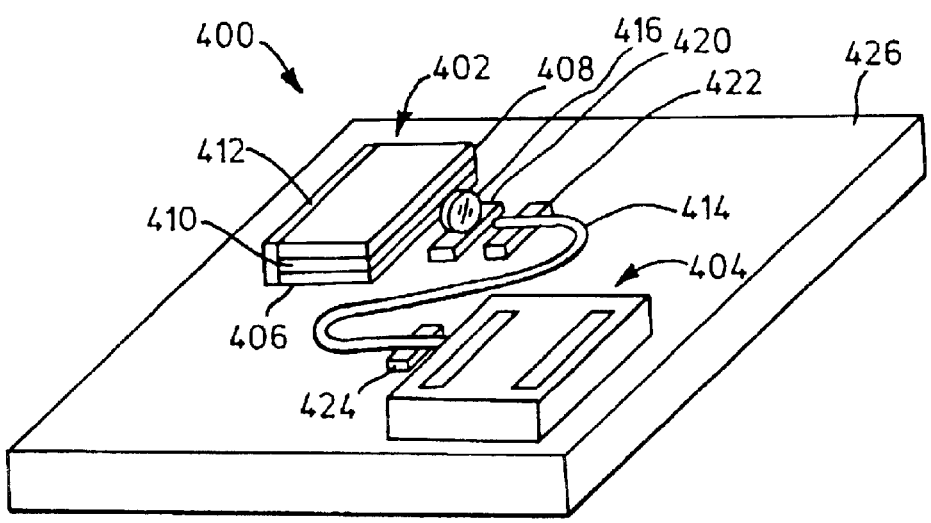
FIG. 7 is an illustration of an example tunable laser having a gain region coupled to a tunable acousto-optic modulator via a fiber coupling.

FIG. 7 shows an example tunable laser 400 having a laser source 402 and a tunable AOM 404 similar to the structures 302 and 304 of FIG. 5. The example laser assembly 402 includes a first cladding layer 406, a second cladding layer 408 and a gain region 410 therebetween. A mirror 412, which may be highly reflective at all tunable wavelengths, is disposed on one end of the assembly 402. Whereas components 302 and 304 were adjacent to one another, the laser source 402 and the AOM 404 are spaced apart and are coupled to one another via a waveguide, e.g., an optical fiber 414. The optical fiber 414 couples laser energy from the laser source 402 into the tunable AOM 404. Laser energy may exit from the partially transmitting AOM 404.

In the example of FIG. 7, a lens 416 mounted to a support 420 collects laser energy and couples it into the fiber 414. Supports 422 and 424, affixedly mounted to a substrate 426, retain the fiber 414 in position for optimum coupling and negligible bending losses. The supports 422 and 424 may be augmented, replaced, or removed, as desired. The fiber 414 may be coupled to the assembly 404 via an exit face, a pigtail, a buffer, or the like. Alignment between the modules 402 and 404 need not be controlled to high tolerances due to the use of the waveguide coupling.

Figure 8:
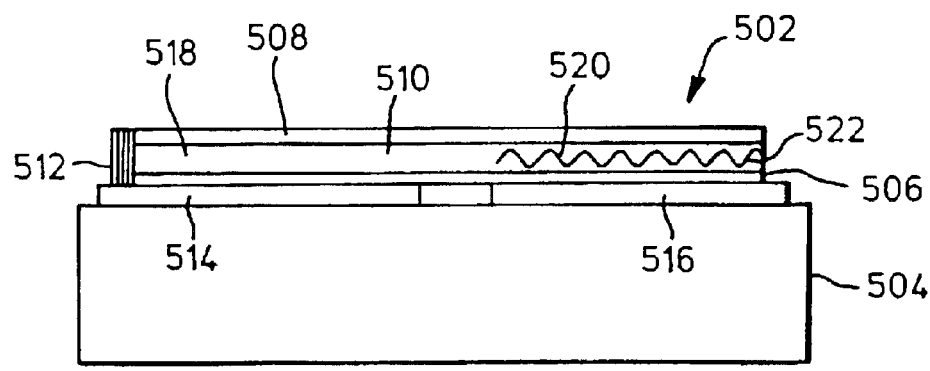
FIG. 8 is a side illustration of an example tunable laser in which only portions of a gain region receive an acoustic wave.

FIG. 8 illustrates an example tunable laser 500 that also may be used as the laser 126. The laser 500 is formed of a laser source 502 positioned above an ultrasonic transducer 504 that may be formed of a piezoelectric material. In the illustrated example, the laser assembly 502 includes a first cladding layer 506 and a second cladding layer 508 with a gain region 510 therebetween. A mirror 512 is disposed at one end of the laser assembly 502 and may be like those previously described, though it could also be an AOM.

In operation, an ultrasonic wave is formed in the ultrasonic transducer 504 via an RF drive signal provided to electrodes (not shown). The ultrasonic wave produced by the drive signal couples into the gain region 510 in a similar manner to that shown in FIG. 1. In the tunable laser 500, however, the location of the ultrasonic wave within the gain region 510 is controlled by patterning various couplers between the laser source 502 and the ultrasonic transducer 504. In the illustration, for example, two couplers 514 and 516 are disposed on a top surface of the transducer 504 between the transducer 504 and the laser source 502.

The first coupler 514 is a poor acousto-optic coupler that shields the portion of the gain region above it (region 518) from the ultrasonic wave within the ultrasonic transducer 504. The poor coupler 514 may be a spongy material, such as a silicon gel that absorbs any sound waves before they impinge upon the region 518. Other suitable materials will be known to those of ordinary skill in the art. The thickness will also affect the coupling properties of the coupler 514. In contrast, the coupler 516 is formed of a material that is a good acousto-optic coupler to ensure that ultrasonic waves from the transducer 504 are coupled into the gain region 510, in particular, into a region thereof labeled 520. A resultant index of refraction perturbation 522 is shown by a sinusoidal line in FIG. 8. Typically the coupler 516 is a hard material such as solder.

As illustrated, a laser source having a single gain region and only one highly reflective mirror at one end may be formed into an ultrasonic tunable laser by forming a tunable mirror at the opposing end of the gain region. In the example of FIG. 8, therefore, region 520 forms a tunable reflector opposite the reflector 512. The laser assembly 502 has been formed into a distributed feedback laser system tunable by changing the drive signal that controls the ultrasonic transducer 504. The layers 514 and 516 are examples of intermediate couplers that define an index of refraction pattern within the gain region. Of course, any number of couplers may be used to define any desired patterns.

Figure 9:
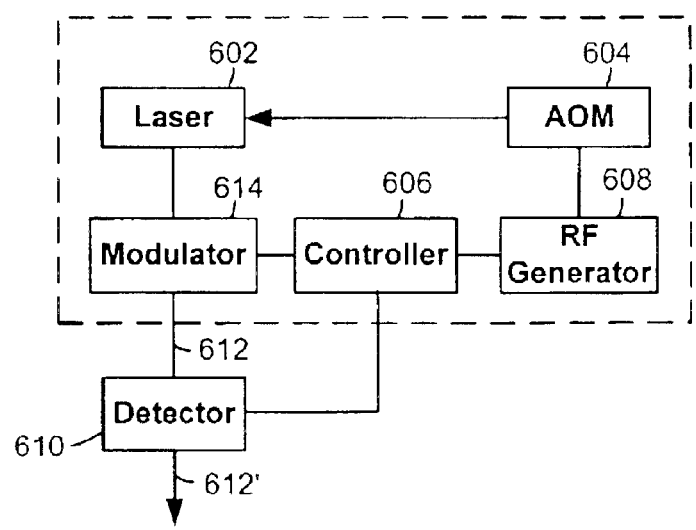
FIG. 9 is a block diagram of an example feedback control circuit for any of the tunable lasers depicted in FIGS. 3–8.

The tunable lasers described herein may be used in a feedback control system, an example of which is shown in FIG. 9. In the illustrated control system of FIG. 9, a tunable laser 600 includes a laser source 602 and an acousto-optic modulator or ultrasonic transducer (AOM/UT) 604. The AOM/UT 604 may be any of the AOMs or ultrasonic transducers described above. For example, the AOM/UT 604 may supply an ultrasonic wave to the laser source 602 or may serve as an external mirror. If desired, the AOM/UT 604 may include multiple AOMs or multiple ultrasonic transducers.

A controller 606 controls the AOM/UT 604 by controlling or changing the RF drive signal applied to the AOM/UT 604 by an FR signal generator 608. The controller 606 may be a microprocessor, analog controller, chipset, ASIC, or the like. Examples available from Intel Corporation have been provided above.

Tuning of the laser 602 is performed through a feedback loop, whereby the controller 606 receives a signal from a detector 610 coupled to receive an output 612 from the laser source 602. The detector 610 may by a photo-detector, for example. If the detected laser light frequency does not match the desired frequency, then the controller 606 determines what adjustments need to be made to the RF drive signal sent to the AOM/UT 604 to produce the desired frequency.

In the example of FIG. 9, the detector 610 is partially transmitting so that only a small portion of the output 612 is detected and the remaining portion 612' is transmitted. In this way, the detector 610 need not disrupt operation of the tunable laser 600. The detector 610 may also be used in an intensity feedback loop control and specifically to prevent intensity dependent losses like stimulated Brillouin scattering (SBS). Numerous SBS suppression techniques are known. The illustration shows the controller 606 connected to a modulator 614. The controller 606 may signal the modulator 614 to apply a slow Hz ripple on the laser output wavelength. Such modulation is a known SBS suppression technique. This kind of feedback control may be particularly beneficial in long-haul and ultra-long haul applications where higher output intensity signals are generally employed.

Numerous alternatives will be apparent to persons of ordinary skill in the art. While certain blocks are shown, these may be replaced or augmented as desired. Further, while blocks are illustrated as forming part of the laser 600, it will be understood that any number of blocks may be separate structures coupled to the laser 600.

Examples described herein may exhibit greater stability over known devices, because there is no float in the acoustic wave wavelength over time. Therefore, recalibration is reduced or eliminated. Any of the above described tunable lasers may be formed into a transponder, as might be used in an optical network. Yet, these tunable lasers may be stand-alone or incorporated into other optical devices that may utilize a tunable laser source. Furthermore, while the teachings herein were described in illustrated examples, any of the techniques may be combined with other techniques as desired.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalence.

We claim:

1. A tunable laser for producing a laser energy at a frequency, the tunable laser comprising:

gain region having an index of refraction and being adapted to propagate at least a portion of the laser energy;

a first acousto-optic coupler having a first acousto-optic coupling efficiency and coupled to the gain region;

a second acousto-optic coupler having a second acousto-optic coupling efficiency different from the first acousto-optic coupling efficiency and coupled to the gain region; and an ultrasonic transducer mounted to the first acousto-optic coupler and the second acousto-optic coupler adapted to produce an ultrasonic wave within the gain region and to define an index of refraction pattern within the gain region, wherein the frequency of the laser energy varies with the index of refraction pattern.

2. The tunable laser of claim 1, further comprising a first cladding region adjacent the gain region and a second cladding region adjacent the gain region, wherein the first acousto-optic coupler and the second acousto-optic coupler are mounted to one of the first cladding region or the second cladding region.

3. The tunable laser of claim 1, wherein the first acousto-optic coupler completely blocks the ultrasonic wave from entering a first portion of the substrate.

4. The tunable laser of claim 1, wherein the second acousto-optic completely couples the ultrasonic wave into a second portion of the gain region.

5. A laser transponder comprising:
   a controller comprising:
      a deserializer,
      an encoder, and
      a serializer;
   a tunable laser coupled to the serializer and encoder and comprising:
      a laser source for producing a laser energy at a frequency, the laser source including a gain region having an index of refraction and being adapted to propagate at least a portion of the laser energy,
      a first acousto-optic coupler having a first acousto-optic coupling efficiency and coupled to the gain region,
      a second acousto-optic coupler having a second acousto-optic coupling efficiency different from the first acousto-optic coupling efficiency and coupled to the gain region, and
      an ultrasonic transducer mounted to the first acousto-optic coupler and the second acousto-optic coupler to produce an ultrasonic wave within the gain region in response to control by the controller and to define an index of refraction pattern within the gain region, wherein the frequency of the laser energy varies with the index of refraction pattern.

6. The laser device of claim 5, further comprising a modulator coupled to the laser source for modulating the laser energy to form an output energy.

7. The laser device of claim 6, further comprising a detector for receiving a portion of the output energy, the detector being coupled to the controller.

8. A method of tuning a laser frequency, comprising:
   producing a laser energy at the laser frequency and propagating in a gain region;
   producing an ultrasonic wave;
   coupling the ultrasonic wave to a first acousto-optic coupler having a first acousto-optic coupling efficiency and a second acousto-optic coupler having a second acousto-optic coupling efficiency different from the first acousto-optic coupling efficiency, wherein the first acousto-optic coupler and the second acousto-optic coupler are coupled to the gain region,
   coupling at least a portion of the ultrasonic wave to the gain region for forming an index of refraction pattern within the gain region, wherein the laser frequency is dependant upon the index of refraction pattern.

9. The method of claim 8, wherein the first acousto-optic coupler substantially blocks the ultrasonic wave from entering a first portion of the gain region, and wherein the second acousto-optic coupler substantially couples the ultrasonic wave into a second portion of the gain region, wherein the second portion forms a frequency-dependent mirror within the gain region.

10. The method of claim 8, further comprising:
   measuring the laser frequency of the laser energy;
   deriving a drive signal from a comparison of the measured laser frequency to a desired laser frequency for the laser energy; and
   in response to the derivation, changing a frequency of the ultrasonic wave if the measured laser frequency does not equal the desired laser frequency.

* * * * *

UNITED STATES PATENT AND TRADEMARK OFFICE
CERTIFICATE OF CORRECTION

PATENT NO.    : 6,898,217 B2
DATED         : May 24, 2005
INVENTOR(S)   : Williams et al.

It is certified that error appears in the above-identified patent and that said Letters Patent is hereby corrected as shown below:

Column 9,
Line 2, please delete "adapted".
Line 20, please delete ":" and insert -- , --.
Line 25, please delete ":" and insert -- , --.

Column 10,
Line 23, please delete "dependant" and insert -- dependent --.

Signed and Sealed this

Thirteenth Day of September, 2005

JON W. DUDAS
*Director of the United States Patent and Trademark Office*